United States Patent [19]

Kaniel

[11] 4,150,433
[45] Apr. 17, 1979

[54] AUTOMATIC COMMON MODE REJECTION IN AN ANALOG MEASURING SYSTEM

[75] Inventor: Akavia Kaniel, Framingham, Mass.

[73] Assignee: Digital Equipment Corporation, Maynard, Mass.

[21] Appl. No.: 842,699

[22] Filed: Oct. 17, 1977

[51] Int. Cl.² .............................................. H03K 13/02
[52] U.S. Cl. .................................... 364/571; 73/362.4; 340/347 CC
[58] Field of Search ................. 364/571; 340/347 CC; 73/1 R, 1 F, 361, 362.4; 324/98, 101, 105, 130

[56] References Cited

U.S. PATENT DOCUMENTS

| | | | |
|---|---|---|---|
| 3,641,563 | 2/1972 | Cushman et al. | 340/347 CC X |
| 3,781,869 | 12/1973 | Sudnick et al. | 364/571 X |
| 3,903,743 | 9/1975 | Noller | 73/361 |
| 3,982,241 | 9/1976 | Lipcon | 340/347 CC |
| 4,020,487 | 4/1977 | Winter | 340/347 CC X |
| 4,063,447 | 12/1977 | Mathison | 364/571 X |

*Primary Examiner*—Jerry Smith
*Attorney, Agent, or Firm*—John M. Gunther; Thomas C. Siekman; Arthur W. Fisher

[57] ABSTRACT

An analog measuring system is disclosed which simultaneously stores in a first memory element a voltage generated by a physical phenomenon including the errors introduced by the measuring system and in a second memory element a voltage corresponding to the errors introduced by the measuring system. Subsequently, the voltages are combined so that true electrical representation of the physical phenomenon is provided. Additional means are disclosed which establish a reference for the physical phenomenon. The electrical representation of the reference is combined with the electrical representation of the sensed physical phenomenon to provide an absolute reading. Thus, the measuring system provides an electrical representation of the physical phenomenon which is independent of time, temperature and frequency.

10 Claims, 4 Drawing Figures

AUTOMATIC COMMON MODE REJECTION IN AN ANALOG MEASURING SYSTEM

BACKGROUND OF THE INVENTION

Field of the Invention

This invention is concerned with measuring systems and, more particularly, with errors generated by an analog-to-digital measuring system.

To measure physical phenomena, such as pressure, temperature, light, etc., a transducer is used to sense the physical phenomena. The transducer then produces an electrical representation corresponding to the sensed phenomena. This may be a voltage, current, resistance or capacitance. An electronic measuring system then takes this information from the transducer and generates an output quantifying the characteristics of the particular phenomenon.

The basic requirement for obtaining accurate results is that the transducer and the measuring system introduce no additional electrical representations so that only the actual physical phenomenon is measured. However, in the past, this problem has only been partially solved and then only with the use of extremely sensitive and costly devices.

In viewing a typical system as shown in FIG. 1, prior art, a physical phenomenon, such as heat, is measured by a thermocouple transducer 10. It produces a voltage Vn between leads 12 and 14 which identifies the difference in temperature between wires 12 and 14. The voltage Vn is a function of the original temperature (T2) of the reference junction of the thermocouple 36, and a function of the heat sensed by the transducer (T1). Since the temperature (T2) of the reference junction of the thermocouple 36 is usually not known, an error voltage Ve is introduced. The voltage Vn is provided to a measuring system 28 which includes a differential amplifier 20. Amplifier 20 is grounded 22 to the measuring system 28 which is usually different than the ground 16 of the transducer. As a result, a common mode voltage Vcm is introduced. Vcm varies as a function of the frequency and time. In addition, differential amplifier 20 introduces an offset error voltage Vos 18 which represents an incremental input voltage into the input of amplifier 20 necessary to provide an exact zero output voltage from the amplifier.

Some of the error voltages which have been generated in the measuring system have been negated by an apparatus disclosed in a previous patent issued to Mr. Jesse Lipcon, U.S. Pat. No. 3,982,241, issued on Sept. 21, 1976 and assigned to the same assignee of this instant invention. However, the problems of defining an absolute reference voltage and eliminating the common mode error voltage, while partially satisfied, were not completely addressed. Moreover, other prior art devices have not addressed this problem in the manner to be disclosed. These prior art systems involve substantial complexity by requiring a number of precise electrical components added to the measuring system as well as introducing a number of additional circuits to compensate for the errors generated. As is apparent, the above solutions require more complex circuitry as well as significant additional expense.

OBJECTS OF THE INVENTION

It is, therefore, a primary object of this invention to provide a measuring system which overcomes the above recited limitations.

It is a further object of this invention to provide an improved measuring system which reduces the number of components incorporated in the measuring system as well as utilizes inexpensive components.

It is yet a further object of this invention to provide an improved measuring system which generates a true representation of a sensed physical phenomenon.

BRIEF DESCRIPTION OF THE DRAWINGS

The foregoing and other objects, features and advantages of the invention will be apparent from the following, more particular description of the preferred embodiment of the invention illustrated in the accompanying drawings, of which.

DETAILED DESCRIPTION OF THE PREFERRED EMBODIMENT

Figure 1:
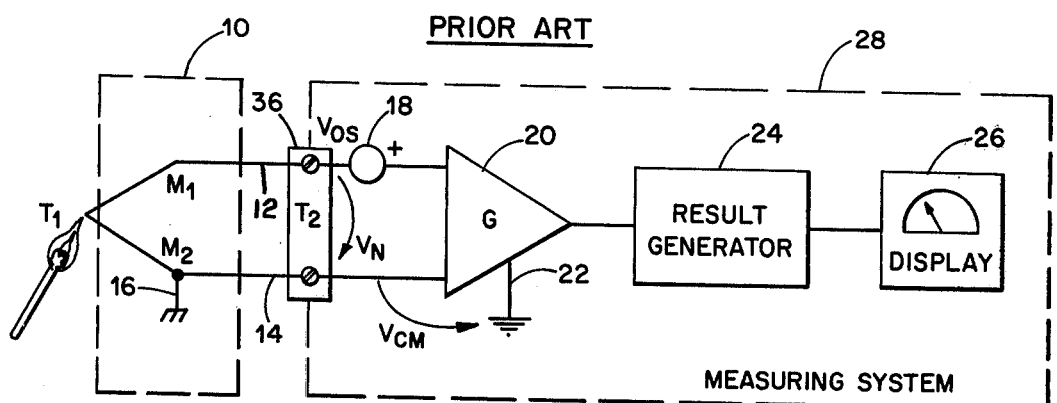
FIG. 1: is a schematic diagram of a prior art measuring system.
Figure 2:
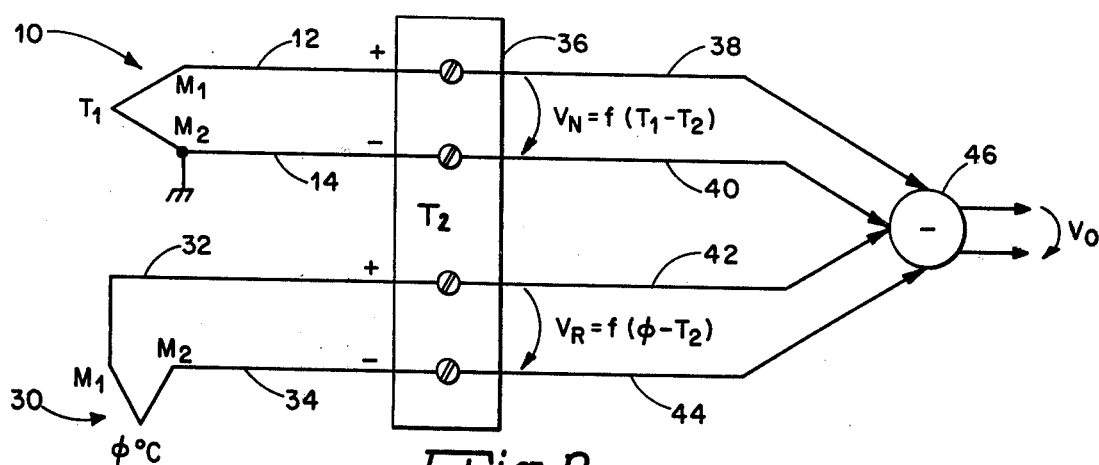
FIG. 2: is the voltages existing in schematic diagram of a transducer 10 and a reference transducer 30.

FIG. 2 shows an implementation of a transducer which measures a physical phenomenon in absolute terms. As is well known, in FIG. 1 thermocouple transducer 10 measures the temperature of a flame by creating a voltage difference between lines 12 and 14. This voltage difference includes an error value which is based on the (T2) reference junction temperature of the thermocouple itself. Stated differently, if the flame is 100 degrees C. and the reference junction 36 is at a temperature of 5 degrees C., thermocouple 10 will only provide a voltage corresponding to a temperature of 95 degrees C. Moreover, this reference junction temperature varies during the day, seasons, etc. What is desired is to measure the point where the thermocouple wires are terminated 36 and add a correction factor to the measurement which gives a voltage which directly represents the temperature (T1). As shown in FIG. 2, this is accomplished by the addition of a second thermocouple 30. This thermocouple 30 senses a reference temperature of zero degrees C. and the sensed voltage difference is provided over wires 32 and 34 into the termination device 36.

In viewing the termination device 36, it is seen that the difference between the inputs on wires 12 and 14 is a function of the difference in temperature between the flame (T1) and the thermocouple wires termination (T2). As a result, the voltage output over wires 38 and 40 is shown as $Vn = F(T1 - T2)$. By the addition of thermocouple 30, the reference voltage Vr provided at wires 42 and 44 is equal to the difference of the referenced temperature minus the termination point temperature (T2). This is spelled out as the temperature Vr is equal to the $F(\phi - T2)$.

Element 46, which can be any well-known arithmetic element in the art, combines the two voltages and provides as an output voltage Vo which is merely a function of T1. Thus, $Vo = F(T1 - T2) - F(\phi - T2)$ which $= F(T1)$. Thus, the output voltage Vo provides a result which corresponds to the absolute temperature of the thermocouple (T1) independent of the measuring system's temperature (T2). This is important in data acquisition systems where it is desired to measure how much one input varies with respect to another referenced input.

Figure 3:
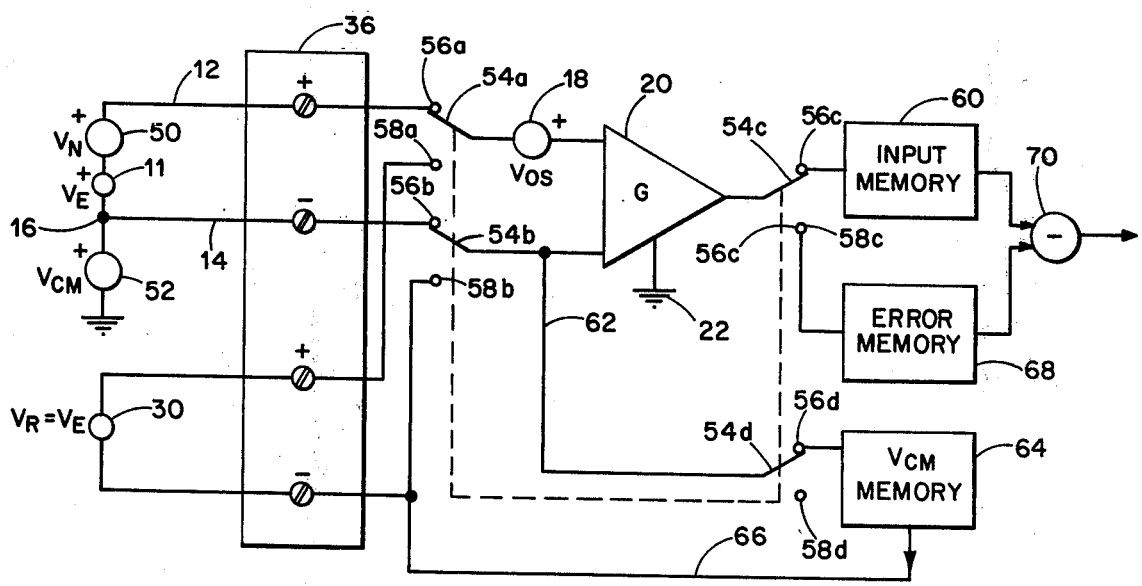
FIG. 3 is a block diagram of the preferred embodiment of this invention.

A second feature of the invention is shown in FIG. 3 which shows in block form a preferred embodiment of how common mode voltage rejection is obtained. FIG. 3 shows a voltage source Vn 50 which is equivalent to the voltage generated by transducer 10 in sensing a physical phenomenon. This voltage Vn is provided into a termination device 36. In addition, a common mode voltage Vcm source 52 is also shown. This voltage Vcm results since the thermocouple device 10 is usually distinct from the measuring system 28. Thus, the thermocouple's ground 16 differs from the ground 22 of the measuring system. As is well known, a voltage difference may result based on changes frequency and 1 or time during which the voltage is measured. This can be represented as Vcm between the ground voltage 22 of the measuring system and the ground voltage 16 of the transducer.

For example, the thermocouple might be hooked to a device which is at 5 volts above ground at a particular instant of time. In this particular example, assume that the physical phenomenon represents a difference of 10 millivolts. For this example, line 12 would be at 5.010 volts but line 14 would be at 5 volts.

In highly sophisticated measuring systems, circuitry is designed which translates the 5 volt common mode voltage to microvolts of error. In less sophisticated systems, this common mode voltage may be translated to a larger error which then becomes buried in the data and misrepresents the actual data. Prior art measuring systems attempted to improved upon the elimination of common mode voltage errors by providing expensive designs in order to eliminate common mode voltage errors. Again, as recited above, the common mode voltage error results since the measuring system ground is different than the transducer ground, the latter being at the point where the experimentation occurs.

As shown in FIG. 3, the output of termination device 36 is provided to a double pole switch 54 which connects to differential amplifier 20. Initially, switch 54 is coupled to terminal 56 which results in a continuous sensing of voltage Vn. After the physical phenomenon is sensed, the double pole switch 54 is switched into its lower position from terminals 56 to 58. At this time, the input memory 60 stores a voltage which is commensurate to Vn but also includes the errors caused by the common mode voltage Vcm, the offset voltage Vos and the environmental voltage Ve.

In addition, during this time of sampling, common mode voltage memory 64 receives an input over line 14 through terminals 56b and double pole switch 54b through lines 62 to common mode voltage memory 64 which identifies the voltage difference between the ground of the transducer 16 and the ground of the measuring system 22. Thus, the common mode voltage is generated simultaneously into both the input memory 60 and the common mode voltage memory 64. Upon switching the double pole switch from terminals 56 to 58, the voltage at input memory 60 is fixed as well as the voltage in common mode voltage memory 64 is fixed. However, in the hold state, the common mode voltage from memory 64 is provided via line 66 and terminals 58 through switch 54 to differential amplifier 20 into an error memory 68. Thus, error memory 68 stores the errors created by the common mode voltage memory 64, offset voltage Vos 18 and the reference voltage Vr. These errors are then combined by device 70 which provides a representation of the actual physical phenomenon. It should be noted that Vr 30 is set to equal Ve.

The above may be shown mathematically by the following equations. Input memory has a voltage V equal to (Vn+Ve+Vcm/Cmrr+Vos) * (the differential amplifier gain 20). The term Cmrr is the Common Mode Rejection Ratio of amplifier 20. Cmrr is based on the imperfection in the resistors and amplifiers in amplifier 20. Since the actual common mode voltage is provided to both input memory 60 and 64, it will automatically be negated. During the hold mode, the voltage at error memory 68 is equal to Vo which equals (Vr+Vcm/Cmrr+Vos) * (the differential amplifier gain 20). Thus, the voltage out of device 70 is V−Vo=[(Vn+Ve+Vcm/Cmrr+Vos)−(Vr+Vcm/Cmrr+Vos)] * (the differential amplifier gain) or (Vn) * (differential amplifier gain). Note, that all the error terms in V are substracted out which result in the actual voltage.

As is apparent, the above configuration eliminates the common mode voltage error by sampling the common mode voltage at the instant that the input voltage is sampled and then transferring the common mode voltage back through the system to offset any errors which were created by its inclusion. This results in only the voltage created by the physical phenomenon sensed by the transducer.

Figure 4:
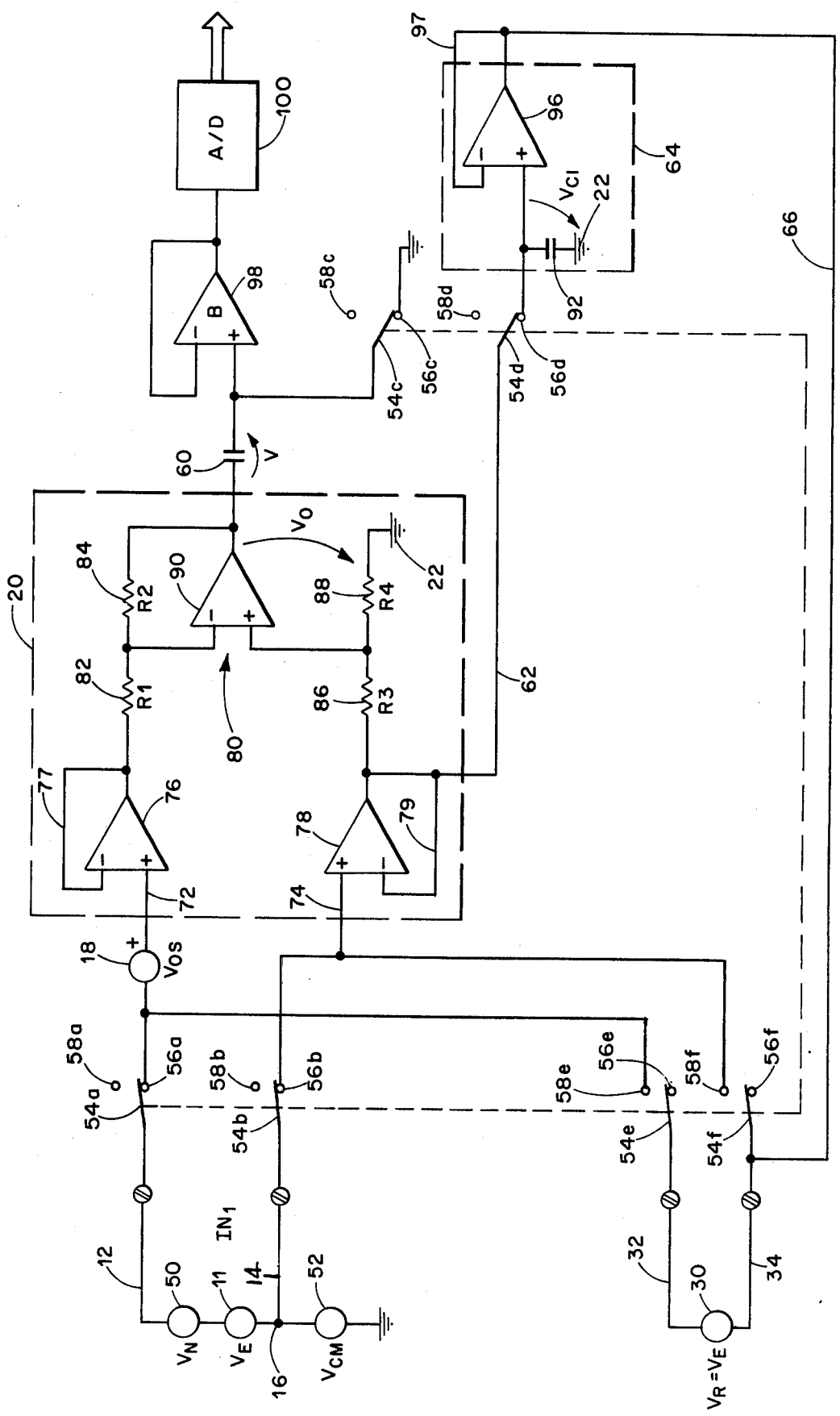
FIG. 4 is a detailed schematic diagram illustrating the preferred embodiment of the instant invention.

Referring now to FIG. 4 which shows the detailed schematic of the preferred embodiment of the instant invention, the elements which have been shown previously are numbered the same for consistency. Thus, in FIG. 4 the input into differential amplifier 20 is provided by the sensed voltage Vn 50, the offset voltage Vos 18, the reference junction voltage Ve 11 and the common mode voltage Vcm 52 into operational amplifier 76 over line 72. In addition, operational amplifier 78 receives the common mode voltage 52 over lines 14 through switch 54 and line 74. The difference between the voltage at operational amplifiers 76 and 78 is provided to a bridge network 80 comprising resistor 82 (R1), resistor 84 (R2), resistor 86 (R3) and resistor 88 (R4) to an operational amplifier 90. The elements 76 to 90 comprise differential amplifier 20.

Since operational amplifiers 76, 78 and 90 have a high input impedance with the feedback circuits as shown by 77 and 79, the errors caused by wires, switches, etc. are automatically negated. These errors would be introduced by a resistance, but because of the essentially infinite input impedance in the operational amplifiers, this is negated. The Vn normal mode voltage is amplified by the ratio of the resistors R1 to R2. For accurate gain, this ratio must be stable versus time and temperature variations.

The output of differential amplifier 20 is provided to an input memory element 60 which is shown here as a capacitor. Thus, capacitor 60 has a voltage V which is equal to (Vn+Ve+Vcm/Cmrr+Vos) * (differential amplifier 20 gain). Simultaneously, memory 64 receives a voltage Vcm 52 via line 62 and switch 54. Memory element 64 comprises a capacitor 92 which is connected to ground 22 and an operational amplifier 96 which has a gain of one by its feedback wire 97. The voltage into memory element 64 is stored simultaneously with the voltage stored at input memory element 60. Moreover, the ground for capacitor 64 is at the same level as the ground for differential amplifier 20 since they are in the same measuring device.

Upon switching from the sample state to the hold state, switch 54 is switched from terminal 56 to terminal 58. This results in the voltage at memory element 64 being transferred over line 66 to wire 74 into operational amplifier 78. In addition, operational amplifier 76 receives a reference voltage Vr 30 and the voltage from memory element 64 via wires 66 and 34. These voltages are then transferred to memory element 60 and cancel out each of the error voltages.

In the sample state, the voltage at element 60 equals $V = -(Vn + Ve + Vos) * R2/R1 + Vcm * [1-(R3/R4) * (R2/R1) \text{ over } 1+R3/R4]$. When the double pole switch 54 is moved to the hold state, the voltage Vo out of amplifier 20 is $Vo = -(Ve + Vos) * R2/R1 + Vcm * [1-(R3/R4) * (R2/R1) \text{ over } 1+R3/R4]$. The voltage at the input of amplifier 98 is $Vo - V = Vn * R2/R1$. The ratio of resistor R2 to R1 is the gain of the measuring system that one desires. The resistances R3, R4 provided in the above equation cancel out. This essentially eliminates the high precision needed in resistors R3, R4 in the past.

As a result, the voltage to amplifier 98 is equal to Vn * R2/R1 which is the amplified absolute transducer reading. Since the common mode voltage error in both memories was generated at the same instant of time and since the common mode voltage error is then passed through the same circuitry to the input memory element 60, it is cancelled independently of whatever its value would be based upon frequency and elapsed time.

The output of memory element 60 is then provided to another operational amplifier 98 which has a gain of one into an analog-to-digital converter 100 which provides a digital representation of the analog voltage.

Various modifications of the instant invention may be made within the spirit of the invention. For example, the reference voltage Vr need not be introduced in the system. Operational amplifier 96 maybe deleted since switch 54e and 54f are open at the time the voltage on memory element 64 is being acquired. In addition, the double pole switch may be any well known switch such as CMOS and FET, which are readily available.

The advantages of the instant invention include the maintaining of those features in U.S. Pat. No. 3,982,241. The instant invention also eliminates common mode voltage errors since the common mode rejection of the measuring system is independent of the frequency of the common mode voltage and the length of the conversion time. It also eliminates the need for extremely precise resistors R3 and R4 in the differential amplifier 20 since it automatically cancels out any particular values which are generated by these resistors. Finally, the invention provides an absolute reference voltage by the addition of the voltage reference in order to provide highly accurate data.

From the above disclosure, it is apparent that the apparatus of this invention provides a unique and valuable means for eliminating common mode voltage errors as well as other errors found in a typical measuring system. Other changes may be incorporated into the instant apparatus while still remaining within the spirit of this invention. Hence, it is desired to be only limited by the scope of the claim recited hereunder.

I claim:

1. In a measuring system, an apparatus for eliminating the errors generated by a sensing device and the measuring system, said apparatus comprising:
   A. first means for sensing a physical phenomenon;
   B. means responsive to said first means for characterizing the sensed physical phenomenon into an electrical quantity;
   C. second means coupled to said characterizing means for storing a first electrical representation corresponding to said sensed physical phenomenon;
   D. third means for simultaneously storing a second electrical representation corresponding to errors occurring in said sensing device and said measuring system; and
   E. means for enabling said third means to be combined to said second means through said characterizing means such that said electrical quantity does not include errors occurring from said sensing device or said measuring system.

2. An apparatus as defined in claim 1 and further including:
   A. fourth means for providing a referenced electrical representation for said sensed physical phenomenon, and wherein;
   B. said enabling means combines said referenced electrical representations provided by said fourth means with said first and second electrical representations stored by said second means and said third means resulting in an actual electrical representation of said sensed physical phenomenon with respect to said referenced electrical representation.

3. The apparatus as defined in claim 1 wherein said characterizing means includes a differential amplifier and a resistor bridge circuit.

4. The apparatus as defined in claim 3 wherein said differential amplifier includes a plurality of operational amplifiers.

5. The apparatus as defined in claim 1 wherein said second and third means includes a capacitor.

6. A method for obtaining a true reading of a physical phenomenon, the method comprising the steps of:
   A. sampling the physical phenomenon by a sensing device;
   B. storing in a first memory element a first electrical representation corresponding to said sampling physical phenomenon;
   C. simultaneously storing in a second memory element a second electrical representation corresponding to errors generated by the sensing device and a measuring system; and
   D. combining the values of said first and second electrical representations stored in said first and second memory elements so that a true reading of a physical phenomenon is provided.

7. The method as defined in claim 6 wherein said combining step comprises:
   A. simulanteously disconnecting said sensing device from said first and second memory elements; and
   B. connecting said second memory element to said first memory element through the same circuitry which enabled the storing of said first and second electrical representations.

8. The method as defined in claim 7 and further including:
   A. generating a third electrical representation corresponding to an absolute physical phenomenon;

B. said combining step combining in an arithmetic relationship said first, second and third electrical representations to obtain an absolute value for said physical phenomenon independent of the errors generated in said measuring system and said sensing device.

9. The method as defined in claim 7 and further including the steps of:

A. providing the results of the combining step to an analog-to-digital converter; and
B. providing the output of said converter to a display device.

10. The method as defined in claim 7 wherein said combining step subtracts the value in said second memory element from said first memory element, the result of such subtraction having a value independent of the errors generated by or occurring in said sensing device and said measuring system.

* * * * *